(12) United States Patent
Bergenek et al.

(10) Patent No.: US 9,445,503 B2
(45) Date of Patent: Sep. 13, 2016

(54) CARRIER DEVICE, ELECTRICAL DEVICE HAVING A CARRIER DEVICE AND METHOD FOR PRODUCING SAME

(75) Inventors: Krister Bergenek, Regensburg (DE);
Andreas Biebersdorf, Regensburg (DE); Jörg Erich Sorg, Regensburg (DE)

(73) Assignee: OSRAM GmbH, Munich (DE)

( * ) Notice: Subject to any disclaimer, the term of this patent is extended or adjusted under 35 U.S.C. 154(b) by 49 days.

(21) Appl. No.: 14/234,960

(22) PCT Filed: Jul. 9, 2012

(86) PCT No.: PCT/EP2012/063397
§ 371 (c)(1),
(2), (4) Date: Mar. 18, 2014

(87) PCT Pub. No.: WO2013/013964
PCT Pub. Date: Jan. 31, 2013

(65) Prior Publication Data
US 2014/0190732 A1   Jul. 10, 2014

(30) Foreign Application Priority Data
Jul. 25, 2011   (DE) .................. 10 2011 079 708

(51) Int. Cl.
*H05K 1/18*   (2006.01)
*H05K 3/30*   (2006.01)
*H01L 33/62*   (2010.01)

(52) U.S. Cl.
CPC ............... *H05K 1/183* (2013.01); *H01L 33/62* (2013.01); *H05K 1/18* (2013.01); *H05K 1/182* (2013.01); *H05K 3/301* (2013.01); *H01L 2924/0002* (2013.01); *Y10T 29/49155* (2015.01)

(58) Field of Classification Search
CPC .... H05K 1/183; H05K 1/182; H05K 1/0203; H05K 1/0272; H05K 3/301
See application file for complete search history.

(56) References Cited

U.S. PATENT DOCUMENTS

| | | | |
|---|---|---|---|
| 5,199,879 A * | 4/1993 | Kohn et al. .................... | 439/63 |
| 5,629,239 A | 5/1997 | DiStefano et al. | |
| 5,983,492 A | 11/1999 | Fjelstad | |
| 6,980,017 B1 * | 12/2005 | Farnworth et al. ...... | 324/756.02 |
| 8,263,870 B2 | 9/2012 | Tsumura et al. | |
| 8,633,408 B2 | 1/2014 | Lee et al. | |
| 2006/0028222 A1 | 2/2006 | Farnworth et al. | |
| 2007/0023776 A1 | 2/2007 | Zakgeym et al. | |
| 2009/0267505 A1 | 10/2009 | Lee et al. | |

FOREIGN PATENT DOCUMENTS

| | | |
|---|---|---|
| CN | 101273453 A1 | 9/2008 |
| CN | 101960620 A | 1/2011 |
| DE | 10139681 A1 | 3/2003 |
| DE | 102008011862 A1 | 9/2009 |

(Continued)

*Primary Examiner* — Jeremy C Norris
(74) *Attorney, Agent, or Firm* — Slater Matsil, LLP

(57) ABSTRACT

A carrier device for an electrical component includes a carrier, which includes an electrically insulating layer, and an electrical contact layer on the electrically insulating layer The electrical contact layer includes at least one bridge-shaped contact region At least one recess in the electrically insulating layer is arranged at least on one side surface of the bridge-shaped contact region and/or the bridge-shaped contact region includes a bridge width reducing toward the insulating layer.

20 Claims, 7 Drawing Sheets

(56) References Cited

FOREIGN PATENT DOCUMENTS

| JP | 2000138532 A | 5/2000 |
|---|---|---|
| JP | 200736253 A | 2/2007 |
| JP | 2007180080 A | 7/2007 |
| JP | 2008141073 A | 6/2008 |
| WO | 2005057672 A2 | 6/2005 |
| WO | 2007037190 A1 | 4/2007 |
| WO | 2011032853 A1 | 3/2011 |

* cited by examiner

CARRIER DEVICE, ELECTRICAL DEVICE HAVING A CARRIER DEVICE AND METHOD FOR PRODUCING SAME

This patent application is a national phase filing under section 371 of PCT/EP2012/063397, filed Jul. 9, 2012, which claims the priority of German patent application 10 2011 079 708.4, filed Jul. 25, 2011, each of which is incorporated herein by reference in its entirety.

TECHNICAL FIELD

The present application relates to a carrier device, an electrical device having a carrier device and methods for producing same.

BACKGROUND

Semiconductor chips are known whose electrical connections are all arranged on the underside, via which the semiconductor chips are mounted on a substrate. By way of example, light-emitting semiconductor chips are known which can be electrically connected via electrical connection regions on only one side. On account of the customary manner of production and subsequent mounting, which involves applying the connection regions on the top side of semiconductor layer sequences which have already been produced beforehand, said top side then subsequently being used as the underside for mounting on a carrier, such semiconductor chips are also designated as so-called "flip-chips."

Semiconductor chips of this type afford the advantage that, for example, wire contacts, for instance in the form of so-called bonding wires, are no longer necessary for the electrical connection.

Specifically in the case of so-called "power chips," which are preferably operated with high currents, it is advantageous to solder the chips onto a substrate for good dissipation of heat. One characteristic property of soldering connections is the high mechanical stiffness. In order to avoid damage to the semiconductor chip or the mounting connection of the chip, materials having a coefficient of thermal expansion (CTE) adapted to the semiconductor chip are preferably used as substrate materials. Such an approach leads to a good reliability of the interface between the semiconductor chip and the substrate. In the case of an adapted CTE, meaning in particular an identical or at least comparable CTE, only low mechanical stresses are built up between the semiconductor chip and the substrate. Even under cyclic thermomechanical loading, a good reliability can thus be achieved since the mechanical stresses caused by a CTE mismatch, that is to say a difference in the coefficients of thermal expansion, can be minimized.

However, this approach has the disadvantage that it is necessary to find suitable substrate materials which have a CTE adapted to the CTE of a semiconductor chip and are electrically insulating and have good thermal conductivity. The customary substrate materials for light-emitting semiconductor chips have a CTE in the range of between 4 and 6 ppm/kelvin. They are often combined with ceramic printed circuit boards as substrates, for example, composed of aluminum oxide or aluminum nitride, wherein for example the CTE of AN is in the range of 6 to 7 ppm/kelvin. However, such a material has the disadvantage that it is very expensive.

If the substrate is furthermore formed with a large area, that is to say has a geometrically larger extent than the semiconductor chip, the CTE mismatch problem is shifted from the interface between the semiconductor chip and the substrate to the interface between the substrate and a mounting area on which the substrate is arranged. The mounting area consists very generally of metal and is usually larger than the chip-substrate interface by a multiple. Therefore, the CTE mismatch at least at the interface between the substrate and the mounting area is likewise problematic.

Furthermore, ceramic substrate materials such as, for example, aluminum oxide or aluminum nitride are suitable only to a limited extent for use in relatively large modules. The low ductility of these materials can result in mechanical problems such as panel fracture, for instance. As a result of the high costs for example when using aluminum nitride, the production costs are increased and economic viability is thus jeopardized.

As an alternative, metal core printed circuit boards are appropriate, for example. These materials comprise a metal plate, for example composed of aluminum, which is coated with a dielectric. The actual interconnection plane with the chip mounting areas is applied on the surface of the dielectric. However, metal core printed circuit boards (MCPCB) have a CTE of usually approximately 23 ppm/kelvin in the case of aluminum as the metal core. Therefore, the CTE of such an MCPCB is greater than the CTE of customary semiconductor chip materials by approximately a factor of four. In the case of loads arising from thermal cycling, forces which can lead to the failure of the weakest element are built up as a result of this CTE mismatch. For the case where only low power losses have to be dissipated, it is also possible to use FR4 materials as the substrate, which typically have a coefficient of thermal expansion of 16 ppm/kelvin. In all these cases, however, the CTEs of semiconductor chip and substrate do not match. In the case of loading arising from thermal cycling, forces are built up which can lead to damage to the semiconductor chip and/or the interface or connection between the semiconductor chip and the substrate.

In order to be able to solve this problem, it is also known to link a semiconductor chip to a substrate having a different CTE by means of an elastic connection. In the case of this approach, mounting is effected by means of an organic material, for example, a conductive adhesive, the materials of which enable an elastic deformation of the interface between the semiconductor chip and the substrate. As a result, although mechanical forces can be buffered, typical conductive adhesives have a low thermal conductivity of usually approximately 1.8 W/m·K, with the result that the heat loss which can arise during the operation of customary semiconductor chips cannot be effectively dissipated.

As an alternative thereto, it is also possible to make contact with semiconductor chips by means of a so-called "solder bump array" in a manner comparable to the technique such as is used when constructing so-called "ball grid array" components. In the case of this approach, a mechanical flexibility of the interface between semiconductor chip and substrate is achieved by the metallization being divided among many small soldering locations. However, this does not enable a semiconductor chip to be areally linked to a substrate. The necessary distance between the solder bumps results in considerable losses in the linking area. The dissipation of the heat loss by this linking is significantly poorer compared with an areal linking.

SUMMARY OF THE INVENTION

Embodiments specify a carrier device for an electrical component. Further embodiments specify an electrical device comprising a carrier device. Further embodiments specify methods for producing the same.

In accordance with at least one embodiment, a carrier device for an electrical component comprises a carrier. The carrier comprises, in particular, an electrically insulating layer which comprises a dielectric material, for example a plastic material or a plastic material filled with inorganic fillers, a ceramic material, an oxidized metal or semimetal, a glass, a glass ceramic or a gel-based lacquer, in particular a hybrid composed of inorganic and organic constituents, or at least comprises such a material. By way of example, the electrically insulating layer can comprise a plastic material suitable for printed circuit boards (PCB), or for metal core printed circuit boards (MCPCB). By way of example, the electrically insulating layer can comprise FR4 or be composed thereof. It is also possible for the electrically insulating layer to be formed from an anodically oxidized metal or semimetal foil, for example from anodically oxidized silicon or aluminum. The electrically insulating layer can be part of a layer composite that forms the carrier. By way of example, the carrier can be embodied as a metal core printed circuit board and comprise a metal layer or metal foil composed of aluminum and/or copper, for example, which is enveloped or coated with a plastic material. Furthermore, the carrier can consist of the electrically insulating layer. By way of example, the carrier can be a ceramic carrier in this case.

In accordance with a further embodiment, the carrier device is embodied as a printed circuit board, as a metal core printed circuit board, as a ceramic carrier or as an anodically oxidized carrier.

In accordance with a further embodiment, an electrical contact layer is arranged on the carrier. In particular, the electrical contact layer is arranged on the electrically insulating layer. In other words, the electrically insulating layer forms a surface of the carrier on which the electrical contact layer is applied in direct contact.

In accordance with a further embodiment for producing a carrier device, a carrier having at least one electrically insulating layer is provided and an electrical contact layer is applied in the form of a metal layer, for example a copper layer. Application can be carried out by application by plating or by lamination on the electrically insulating layer of the carrier. In this case, the electrical contact layer can be applied in a patterned fashion with the aid of a photomask or photolayer applied to the carrier beforehand.

For at least some embodiments it can be advantageous if the electrical contact layer is applied with a thickness of greater than or equal to 60 µm. A thickness of greater than or equal to 60 µm and less than or equal to 80 µm has also proved to be particularly suitable.

The embodiments and features described here and hereinafter relate equally to the carrier device and to methods for producing a carrier device and also to methods for producing electrical devices comprising the carrier device.

In accordance with a further embodiment, the electrical contact layer comprises at least one ridge-shaped contact region. By way of example, the metallic contact layer can be applied with a ridge-shaped contact region during the production of a carrier device. Here and hereinafter, ridge-shaped primarily means that the ridge-shaped contact region has, along a ridge extension direction, a length which is greater than a width directed perpendicularly thereto. In particular, the length can exceed the width by a multiple, for example double or more. In accordance with a further embodiment, the ridge-shaped contact region is arranged in a movable fashion on the carrier. In particular, the ridge-shaped contact region can be elastically movable on the carrier. The ridge-shaped contact region can be movable, preferably elastically movable, in particular in a direction perpendicular to the ridge extension direction.

In accordance with a further embodiment, the electrically insulating layer has a recess at least at one side surface of the ridge-shaped contact region. The recess can be formed, in particular, by a depression in the electrically insulating layer or by an opening, projecting through the electrically insulating layer, in the electrically insulating layer. Here and hereinafter, side surface of the ridge-shaped contact region denotes an edge surface of the contact region, which edge surface preferably runs parallel or at least substantially parallel to the ridge extension direction of the ridge-shaped contact region.

In accordance with a further exemplary embodiment, the ridge-shaped contact region is arranged between two recesses or between two partial regions of a recess. The two recesses or the two partial region of a recess are particularly preferably arranged in a manner adjoining the two side surfaces of the ridge-shaped contact region.

In accordance with a further particularly preferred embodiment, the ridge-shaped contact region, apart from one side, is surrounded on all sides by one or a plurality of recesses in the electrically insulating layer, which particularly preferably directly adjoin the ridge-shaped contact region. In other words, that can mean that the ridge-shaped contact region is embodied in a peninsular fashion.

As a result of the formation of the at least one recess in the electrically insulating layer, that part of the electrically insulating layer on which the ridge-shaped contact region of the electrical contact layer is applied is mechanically decoupled at least partly from the rest of the electrically insulating layer at least in a direction perpendicular to the ridge extension direction of the ridge-shaped contact region. A mobility of the ridge-shaped contact region and of the underlying ridge-shaped region of the electrically insulating layer in a lateral direction, that is to say perpendicular to the ridge extension direction, can be made possible as a result. In this case, the mobility can be all the greater, the smaller the width is in comparison with the length of the ridge-shaped contact region and the more deeply the recess projects into the electrically insulating layer.

In accordance with a further embodiment, the carrier is embodied as a metal core printed circuit board, wherein the recess extends through the electrically insulating layer as far as the underlying metal layer.

In accordance with a further embodiment, the electrical contact layer comprises two ridge-shaped contact regions, between which a recess is formed in the electrically insulating layer. In particular, the two ridge-shaped contact regions can be arranged in a manner directed toward one another, that is to say in other words along a line, and have parallel ridge extension directions. In particular, the two ridge-shaped contact regions can be electrically conductively connected to one another via further regions of the electrical contact layer.

In accordance with a further embodiment, the electrical contact layer has a connection region, which is electrically conductively connected to the one or the plurality of ridge-shaped contact regions via further regions of the electrical contact layer.

In accordance with a further embodiment, the electrical contact layer comprises a further contact region, which is electrically insulated from the ridge-shaped contact region. The ridge-shaped contact region and the further contact region electrically insulated therefrom can form two electrical connections, by means of which an electrical component, in particular a flip-chip, for example, can be electrically and mechanically connected. As a result, it can be possible that the distance between the ridge-shaped contact region and the further contact region can be varied by means of the mobility of the ridge-shaped contact region.

Furthermore, the at least one recess can be arranged in the electrically insulating layer between the ridge-shaped contact region and the further contact region insulated therefrom. The at least one recess can be formed, in particular, in the manner adjoining that side surface of the ridge-shaped contact region which faces the further contact region.

In accordance with a further embodiment, the further contact region is embodied as a large-area connection pad for an electrical component. As a result, the further contact region can serve as effective heat dissipation for the electrical component. As an alternative thereto, the further contact region can likewise be embodied in a ridge-shaped fashion and, for instance by means of the measures described, can for example also be movable.

In accordance with a further embodiment, the at least one recess is formed in the electrically insulating layer by at least partly removing the electrically insulating layer at least at one side surface of the ridge-shaped contact region. For this purpose, for example, an etching method can be used, for example wet-chemical etching or ion etching. Alternatively or additionally, the at least one recess can also be formed by laser processing and/or embossing in the electrically insulating layer. Particularly in the case of an etching method, the at least one recess can be formed with the aid of a photomask or a photolayer which is correspondingly patterned.

In accordance with a further embodiment, the ridge-shaped contact region has a ridge width which decreases toward the electrically insulating layer. In this case, the decreasing ridge width can be formed in addition or as an alternative to the at least one recess described above. In particular, the carrier device can comprise a ridge-shaped contact region having a ridge width which decreases toward the electrically insulating layer in combination with the further features mentioned above, as an alternative or in addition to the at least one recess in the electrically insulating layer.

In accordance with a further embodiment, in order to form the ridge width of the ridge-shaped contact region which decreases toward the electrically insulating layer, the ridge-shaped contact region is slightly etched or undercut in particular at least at one and preferably at both side surfaces. What can be achieved by slightly etching the side surfaces is that the ridge-shaped contact region is arranged still in direct contact with the electrically insulating layer with an interface that is less wide in comparison with the top side of said ridge-shaped contact region, said top side facing away from the electrically insulating layer. What can be achieved in the case of undercutting is that the ridge-shaped contact region is detached from the electrically insulating layer at least in one partial region and is thus embodied in a self-supporting fashion at least in this partial region. As already described above in connection with the at least one recess in the electrically insulating layer, a mobility, particularly preferably an elastic mobility, of the ridge-shaped contact region in a direction perpendicular to the ridge extension direction can be achieved by means of the decreasing ridge width of the ridge-shaped contact region in a direction toward the insulating layer.

In accordance with a further embodiment, an etching method, in particular wet-chemical etching or ion etching, is used for forming the ridge width of the ridge-shaped contact region which decreases toward the insulating layer. As an alternative thereto, laser processing and/or embossing can also be carried out. Particularly in conjunction with an etching method, beforehand a photoresist or a photolayer forming a mask can be applied, which is at least partly removed in regions of the side surfaces of the ridge-shaped contact region.

When carrying out the etching method by means of suitable measures are achieved that the underside of the ridge-shaped contact region facing the electrically insulating layer is etched to a greater extent than the top side of said ridge-shaped contact region. By way of example, for this purpose, before the etching method, a hard mask, for example a mask deposited by plating, can be applied on the electrical contact layer. The hard mask can comprise or be composed of, for example, a layer comprising nickel, comprising nickel and gold or comprising nickel, palladium and gold.

In accordance with a further embodiment, the surfaces of the electrical contact layer are refined by the application of one or a plurality of further metal layers after the formation of the at least one recess and/or after the formation of the ridge cross section which decreases toward the electrically insulating layer, or of the decreasing ridge width. By way of example, the one or the plurality of metal layers can be applied by an electroless plating method. In particular, in this case one or a plurality of layers can be applied, comprising or composed of nickel and gold, nickel, palladium and gold, nickel and silver, or silver.

In accordance with a further embodiment, an electrical device comprises a carrier device in accordance with the embodiments described above. Furthermore, an electrical component is arranged on the electrical device, said electrical component being electrically and mechanically connected to the at least one ridge-shaped contact region. The electrical and mechanical connection can be formed by a soldering connection, in particular, which can enable a high strength and an efficient heat dissipation from the electrical component to the electrical contact layer. Furthermore, the electrical and mechanical connection can be formed by a sintering connection, which has a low ductility and enables a good thermal linking of the semiconductor chip. In particular, the carrier device for the electrical device can comprise the contact regions described above, such that the further contact region and the ridge-shaped contact region can form two electrical connections for making electrical contact with the electrical component and for mounting said electrical component.

In accordance with a further embodiment, the electrical component and the carrier device have different coefficients of thermal expansion (CTE). By way of example, the carrier device can be embodied as a printed circuit board, a metal core printed circuit board, a ceramic printed circuit board or an anodically oxidized metal or semimetal foil, for example comprising silicon or aluminum. In the case of a metal core printed circuit board, as carrier, the CTE of the carrier device can substantially correspond to the CTE of the metal core. The carrier device can have, for example, a higher coefficient of thermal expansion than the electrical component. In the case of heating of the carrier device and/or of the electrical component and an unequal thermal expansion thereof associated with said heating, thermomechanical stresses can be compensated for by the mobility of the ridge-shaped contact region on account of the at least one recess or the ridge width of the ridge-shaped contact region which decreases toward the insulating layer. As a result, it is possible to achieve a high reliability of the electrical and mechanical connection of the electrical component to the carrier device, in particular also in the case of cyclic thermomechanical loading. As a result of a preferably large-area further contact region of the electrical contact layer, a good thermal use of the electrical component to the carrier device and thus an effective dissipation of heat from the electrical component can be achieved. Since the CTEs of carrier device and electrical component do not have to be identical in the case of the electrical device described here, cost-effective substrate materials such as metal core printed circuit boards, for example, can be used instead of expensive aluminum nitride ceramic substrates used in the prior art.

In accordance with a further embodiment, the carrier device or the electrical device is arranged on a heat sink. The heat sink is preferably arranged on a side facing away from the electrical contact layer and the electrical component. By way of example, the heat sink can be a metallic heat sink. In the case of the carrier materials that can be used for the carrier device described here, the difference in the coefficient of thermal expansion between the carrier device and the heat sink can be chosen to be small, and ideally equal to zero, such that only low or no thermomechanical stresses occur between the carrier device and the additional heat sink.

The carrier materials described here can, in particular, also be very robust mechanically, for example in the case of a metal core printed circuit board, for example comprising an aluminum layer as metal core. Mechanical stress concentrations such as can be brought about, for example, by instances of screwing, pinching, bending or similar mechanical loads can then be reduced by a plastic deformation of the carrier device. The risk of a panel fracture is therefore lower by a multiple, compared with a ceramic substrate such as an aluminum nitride ceramic.

In accordance with a further embodiment, the electrical device comprises a multiplicity of electrical components, each of which is applied on the carrier device on a respective ridge-shaped contact region and furthermore, for example, also on a further contact region.

In accordance with a further embodiment, the electrical component is embodied as a semiconductor chip with which contact can be made on one side and which comprises at least two connection areas, with which contact can be made separately from one another, on the mounting side, that is to say the side by which the semiconductor chip is placed onto the carrier. By way of example, the semiconductor chip with which contact can be made on one side can be embodied as a flip-chip. Particularly preferably, the electrical component is embodied as a light-emitting semiconductor chip, in particular as a light-emitting semiconductor chip with which contact can be made on one side, for instance as a designed light-emitting flip-chip semiconductor chip. Components of this type are known to the person skilled in the art and will therefore not be explained any further here. The electrical device, in the case of a light-emitting semiconductor chip, can be embodied in particular as a light-emitting device.

The carrier device described here makes it possible, by means of suitable mechanical structures, in particular the ridge-shaped contact region and the at least one recess in the electrically insulating layer and/or the ridge width of the ridge-shaped contact region which decreases toward the insulating layer, to minimize the mechanical stresses occurring at the interfaces between the carrier device and an electrical component mounted on the carrier device. As a result, it is possible to reduce the risk of failure in the case of thermomechanical loads. As described above, this can be made possible by virtue of the fact that parts of the electrically insulating layer are removed in a targeted manner and/or that the electrical contact layer and in particular the ridge-shaped contact region is slightly etched or undercut in a targeted manner, wherein the ridge-shaped contact region is shaped such that a mechanical elasticity is incorporated and the ridge-shaped contact region is thus embodied in a flexible fashion.

BRIEF DESCRIPTION OF THE DRAWINGS

Further advantages and advantageous embodiments and developments of the invention will become apparent from the embodiments described below in conjunction with the figures.

In the exemplary embodiments and figures, identical or identically acting constituent parts may in each case be provided with the same reference signs. The illustrated elements and their size relationships among one another should not be regarded as true to scale, in principle; rather, individual elements such as, for example, layers, structural parts, components and regions may be illustrated with exaggerated thickness or size dimensions in order to enable better illustration and/or in order to afford a better understanding.

DETAILED DESCRIPTION OF ILLUSTRATIVE EMBODIMENTS

Figure 1:
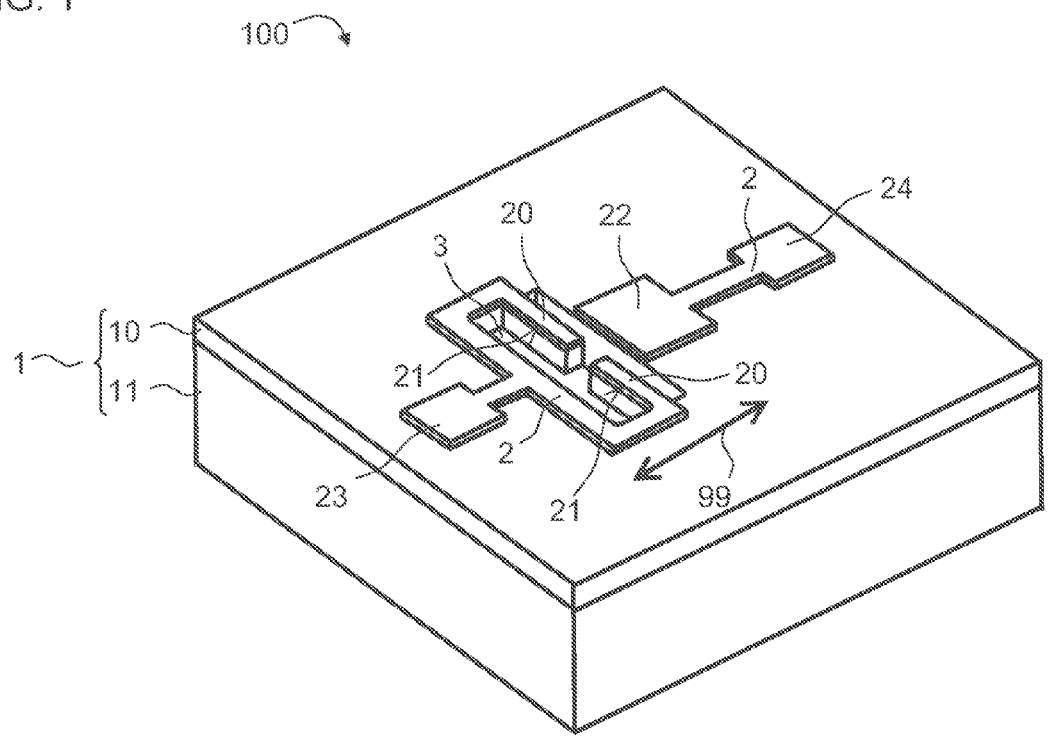
FIG. 1 shows a schematic illustration of a carrier device in accordance with one exemplary embodiment.

FIG. 1 shows one exemplary embodiment of a carrier device 100. The carrier device 100 comprises a carrier 1, which, in the exemplary embodiment shown, is formed an electrically insulating layer 10, formed from a plastic material, for example, a plastic material for circuit boards or printed circuit boards, said electrically insulating layer being arranged on a carrier layer composed of a metal, for example, aluminum. By way of example, the electrically insulating layer 10 and the carrier layer 11 can be parts of a metal core printed circuit board (MCPCB), such that the carrier 1 is embodied as a metal core printed circuit board.

An electrical contact layer 2 is applied on the electrically insulating layer 10, said electrical contact layer forming an interconnection plane of the carrier device 100. As described below in conjunction with a further exemplary embodiment in association with FIGS. 3C and 3D, the electrical contact layer 2 can be produced, for example, by means of a photomask composed of a patternable photoresist. The electrical contact layer can, for example, comprise copper or be composed of copper that is applied by plating or by lamination. Furthermore, the electrical contact layer can comprise further layers, for example, layers comprising nickel, nickel and gold, nickel, palladium and gold, nickel and silver, or silver, in the form of a hard mask or a refinement on the surface facing away from the electrically insulating layer 10 or on all exposed surfaces.

In the exemplary embodiment shown, the electrical contact layer comprises ridge-shaped contact regions 20, which are electrically connected to one another and to a connection region 23 via further regions of the electrical contact layer 2. As an alternative to the exemplary embodiment shown with the two ridge-shaped contact regions 20, the electrical contact layer 2 can, for example, also comprise only one ridge-shaped contact region or more than two ridge-shaped contact regions.

Furthermore, the electrical contact layer 2 comprises a further contact region 22, which is connected to a further connection region 24 via further regions of the electrical contact layer 2. The ridge-shaped contact regions 20 and the further contact region 22 are electrically insulated from one another and serve for electrical connection and fixing of an electrical component, as shown further below in conjunction with the exemplary embodiment in FIG. 2.

In the electrically insulating layer 10, a recess 3 in the form of a depression is formed, in a manner adjoining the side surfaces 21 of the ridge-shaped contact region 20. The recess has a depth that is smaller than the thickness of the electrically insulating layer. As an alternative thereto, the recess 3 can also be formed as an opening in the electrically insulating layer 10, said opening projecting through as far as the carrier layer 11. In the exemplary embodiment shown, the depression 3 extends from the ridge-shaped contact regions 20 as far as the further contact region 22.

The two ridge-shaped contact regions 20, which are arranged in a manner directed toward one another and in a line with their respective ridge extension directions, are separated from one another by a part of the recess 3. In particular, both ridge-shaped contact regions 20, apart from one side, are each surrounded on all sides by regions of the recess 3. As a result, the ridge-shaped contact regions 20 in other words are embodied in a peninsular fashion or in a free-standing fashion apart from one side in each case. The width of the ridge-shaped contact regions 20 is smaller than the respective ridge length in each case by a multiple. As a result of the recess 3, the region of the electrically insulating layer 10 below the ridge-shaped contact regions 20 of the electrical contact layer 2 is mechanically separated from the remaining part of the electrically insulating layer 10 and, on account of the plastic material of the electrically insulating layer 10 and the geometrical design of the ridge-shaped contact regions, has a flexibility, in particular an elastic flexibility, with the double-headed arrow 99 in direction. As a result, the distance between the ridge-shaped contact regions 20 and the further contact region 22 can be varied within the scope of the mobility of the ridge-shaped contact regions 20. The flexibility of the ridge-shaped contact regions 20 is all the greater, the narrower the ridge-shaped contact regions 20 are and the more deeply the recess 3 is formed.

The recess 3 can be produced for example using the same photomask by means of which the electrical contact layer 2 is applied in a patterned fashion, in which after the electrical contact layer 2 has been applied, the photomask is removed in the regions in which the recess 3 is intended to be formed, and the electrically insulating layer thus exposed is at least partly removed by etching, for example, wet-chemical etching or ion etching, or else laser processing. As an alternative thereto, embossing is also possible.

Figure 2:
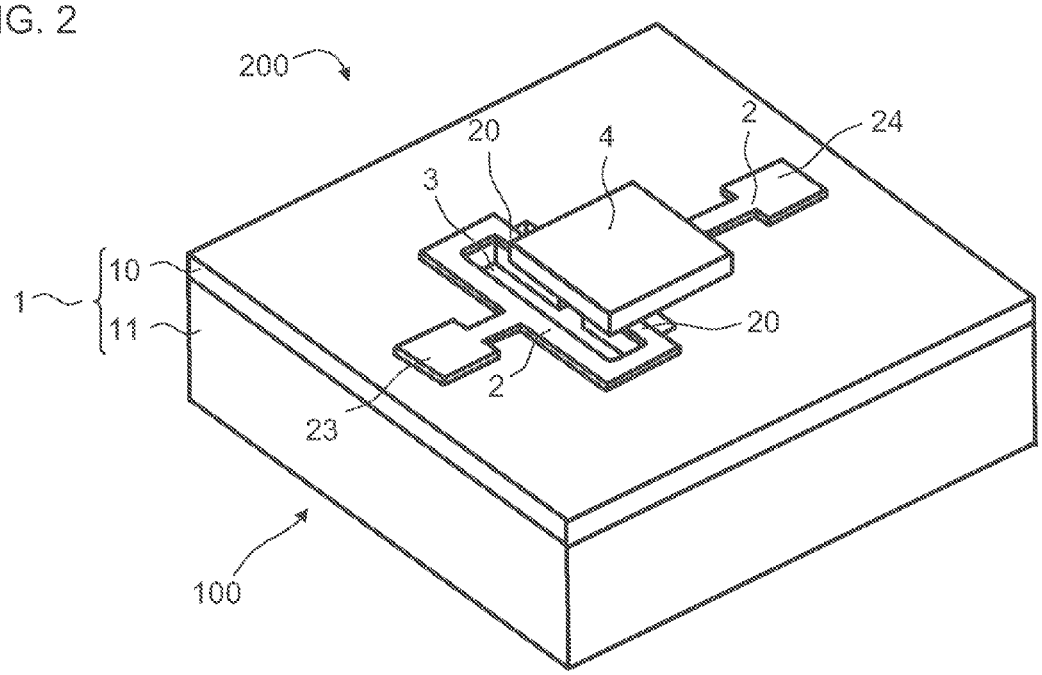
FIG. 2 shows a schematic illustration of an electrical device in accordance with a further exemplary embodiment.

FIG. 2 shows one exemplary embodiment of an electrical device 200 comprising a carrier device 100 in accordance with the exemplary embodiment in FIG. 1. As an alternative thereto, the electrical device 200 can also comprise a carrier device 101 as described in conjunction with the exemplary embodiment in FIGS. 3A to 3H.

The electrical device 200, as described above in conjunction with the carrier device 100 of the exemplary embodiment in FIG. 1, comprises a patterned contact layer 2 on the electrically insulating layer 10.

An electrical component 4 is applied on the electrical contact layer 2, said electrical component being electrically and mechanically connected electrically and mechanically both to the ridge-shaped contact regions 20 and to the further contact region 22. In this case, the electrical component is soldered on the ridge-shaped contact regions 20 and the further contact region 22 of the electrical contact layer 2. The electrical component 4 can be electrically connected to an external current and voltage supply via the connection regions 23 and 24.

The electrical component is embodied in particular as a flip-chip, and particularly preferably as a light-emitting semiconductor chip of flip-chip design. As a result, the electrical device 200 can also be embodied as a light-emitting device.

As a result of the recess 3 being introduced into the electrically insulating layer 10 of the carrier 1 embodied as a metal core printed circuit board, the lateral mobility of the connection metallization formed by the ridge-shaped contact regions 20 is increased, as is indicated by the double-headed arrow 99 in FIG. 1. The electrical component 4 has, purely by way of example, a coefficient of thermal expansion of approximately 4 ppm/kelvin, which is typical of light-emitting semiconductor chips, while the carrier layer 11, which is composed of aluminum in the exemplary embodiment shown, has a coefficient of thermal expansion of 23 ppm/kelvin. The described lateral mobility of the connection metallization reduces the forces caused by the unequal coefficients of thermal expansion (CTE mismatch) of the electrical component 4 and of the carrier device 100, that is to say in particular of the carrier 1 and here primarily of the carrier layer 11 composed of aluminum. In the case of thermomechanical loads such as can arise for example as a result of the heating of the electrical component 4 during operation, high reliabilities are thus achieved since the loads on the connection or interface between the electrical contact layer 2 and the electrical component 4 can be minimized.

As described in the general part, the electrical device 200 can be applied by that side of the carrier 1 which faces away from the insulating layer 10 on a heat sink, for example, a metallic heat sink. On account of the carrier layer 11 composed of aluminum, preferably only low or no thermo-mechanical loads occur between the carrier device 100 and the additional heat sink.

As a result of the large-area embodiment of the further contact region 22 and the electrical connection of the electrical component 4 to the electrical contact layer 2 by means of a soldering connection, it is possible to ensure that heat is effectively transferred away from the electrical component 4 to the carrier device 100.

As an alternative to the exemplary embodiment shown, it is also possible to form the contact region 22 in a ridge-shaped fashion and to provide the electrically insulating layer 10 with a corresponding depression at the side surfaces of the further contact region, in order to further increase the elasticity of the electrical contact layer.

As an alternative to the exemplary embodiment shown, with only one electrical component 4, the electrical device 200 can also comprise a plurality of electrical components 4, with which contact is made in each case by means of corresponding electrical contact layers 2.

FIGS. 3A to 3H show a further exemplary embodiment for producing a carrier device 101, wherein, in particular, the method steps described in FIGS. 3A to 3E are also suitable in the context of producing the carrier device 100 in accordance with the exemplary embodiment in FIG. 1.

Figure 3A:
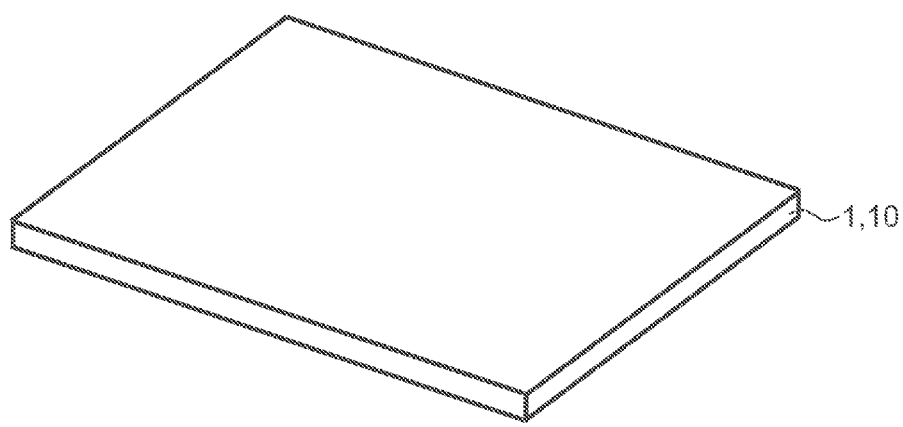
FIGS. 3A to 3H show schematic illustrations of method steps of a method for producing a carrier device in accordance with a further exemplary embodiment.

In a first method step in accordance with FIG. 3A, a carrier 1 is provided, which is formed by an electrically insulating layer 10 composed of a ceramic material in the exemplary embodiment shown. As an alternative thereto, the electrically insulating layer 10 can also be formed from a plastic material, for example, an FR4 material. Such a material is suitable, for example, if the quantities of heat that have to be dissipated are not all that great. As an alternative thereto, the carrier 1 can also be embodied, as in the exemplary embodiment in accordance with FIG. 1, as a metal core printed circuit board or, as an alternative thereto, also as a printed circuit board, a glass substrate, a glass ceramic substrate or an anodically oxidized metal or semi-metal foil, for example, composed of anodically oxidized silicon or aluminum.

Figure 3B:
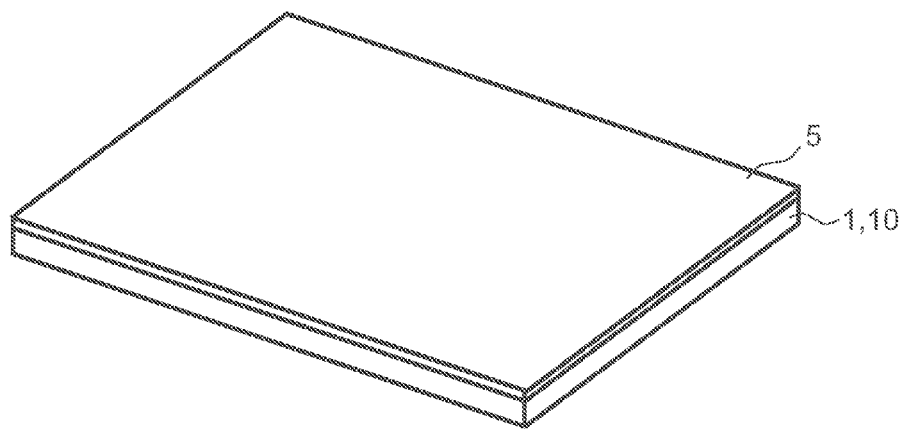
Figure 3C:
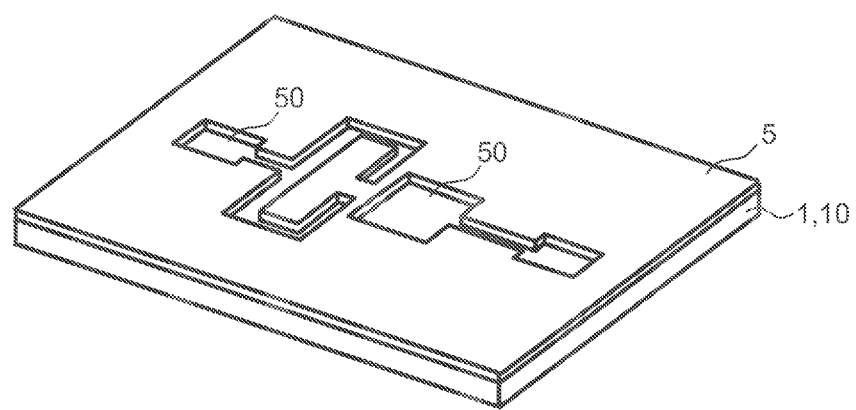
Figure 3D:
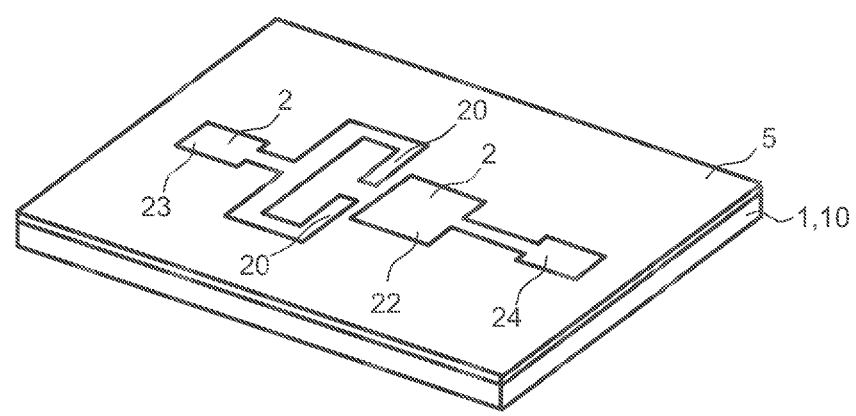

In a further method step in accordance with FIG. 3B, a layer 5 composed of a photoresist is applied to the electrically insulating layer 10 of the carrier 1. As is shown in FIG. 3C, the photoresist 5 is provided with openings 50 by patterning, in which openings, as is shown in FIG. 3D, an electrical contact layer 2 is applied. The latter can be applied, for example, by a plating method or by lamination. In the exemplary embodiment shown, the electrical contact layer is composed of copper and has a thickness of greater than or equal to 60 μm and less than or equal to 80 μm. The geometrical design of the electrical contact layer 2 having the ridge-shaped contact regions 20, the further contact region 22 and the connection regions 23 and 24 correspond to that of the exemplary embodiment in accordance with FIG. 1. As an alternative thereto, a different geometrical embodiment having at least one ridge-shaped contact region 20 is also possible.

Figure 3E:
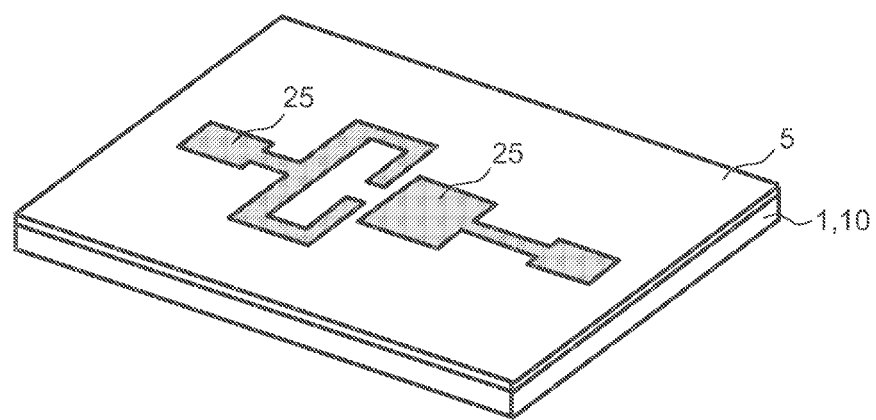

In a further method step in accordance with FIG. 3E, the applied copper layer of the electrical contact layer 2 is protected by a hard mask, which is deposited by plating and which comprises or is composed of, for example, nickel, nickel and gold, or nickel, palladium and gold.

Figure 3F:
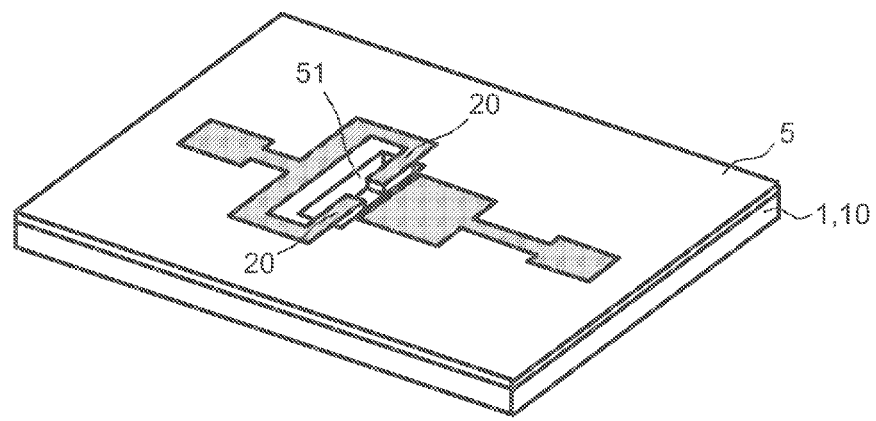

In a further method step in accordance with FIG. 3F, the layer 5 is locally removed in a region of the ridge-shaped contact regions 20 of the electrical contact layer 2 with the formation of a further opening 51. As an alternative thereto, for example, it is also possible for the layer 5 to be completely removed and for a further layer composed of a photoresist to be applied and patterned in the region shown.

Figure 3G:
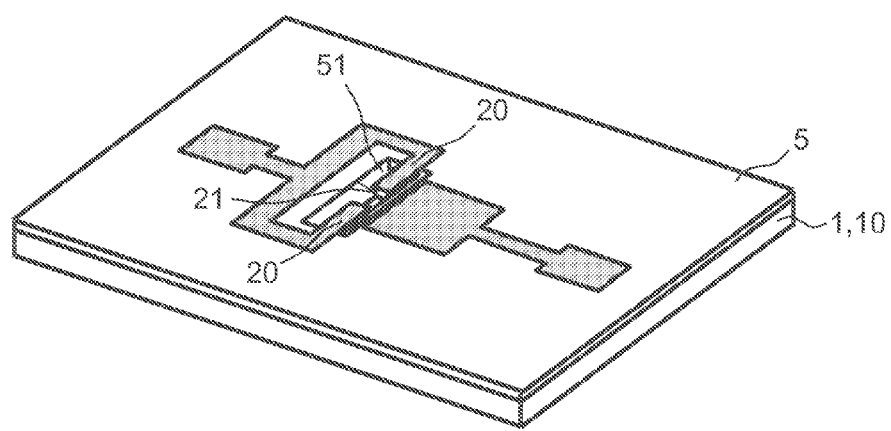

In a further method step in accordance with FIG. 3G, an etching method is carried out, for example wet-chemical etching or ion etching, by means of which the exposed side surfaces 21 of the ridge-shaped contact regions 20 are slightly etched, such that the ridge-shaped contact regions 20 have a ridge width which decreases toward the insulating layer 10 of the carrier 1. Depending on the etching method carried out, the side surfaces 21 can be slightly etched in this case, such that contact still remains between the ridge-shaped contact regions 20 and the insulating layer 10, or else the side surfaces can be undercut, such that the ridge-shaped contact regions are self-supported in the region of the opening 51 of the photomask 5.

Figure 3H:
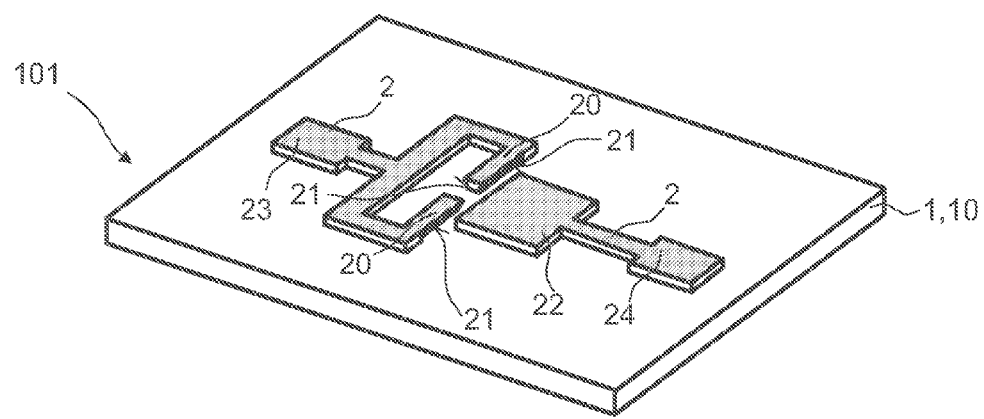

In a further method step in accordance with FIG. 3H, the layer 5 composed of the photoresist is removed and the metal surfaces of the electrical contact layer 2 are covered and thereby refined by means of electroless plating by application of one or a plurality of layers, for example, composed of nickel and gold, composed of nickel, palladium and gold, composed of nickel and silver, or composed of silver.

The locally delimited etching-away of the exposed side surfaces 21 of the ridge-shaped regions 20 results in a weakening of the material cross section of the electrical contact layer 2 in the region of the ridge-shaped contact regions 20. As a result of this slight etching and preferably as a result of an undercutting by etching of the narrow ridge-shaped contact regions 20, the electrical contact layer 2 becomes flexible in the region of the ridge-shaped contact regions 20. Mechanical forces which can occur as a result of differences in coefficients of thermal expansion between the carrier 1 and an electrical component applied thereon are thereby minimized and cannot be transmitted.

FIGS. 4A to 4D show excerpts from carriers 1 having an electrically insulating layer 10 with further exemplary embodiments for arrangements of contact regions 20, 22 of an electrical contact layer 2. In this case, the contact regions 20, 22 can be produced by means of one of the methods described above, for example, with a recess 3, as indicated by the dashed lines in FIGS. 4A to 4D. Alternatively or additionally, the contact regions 20, 22 in the dashed region can be embodied in each case with a ridge width which decreases toward the carrier 1.

Figure 4A:
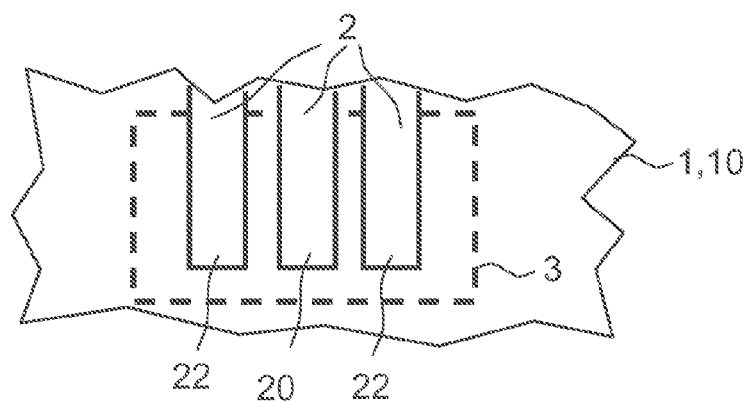
FIGS. 4A to 4D show schematic illustrations of further exemplary embodiments for contact regions.
Figure 4B:
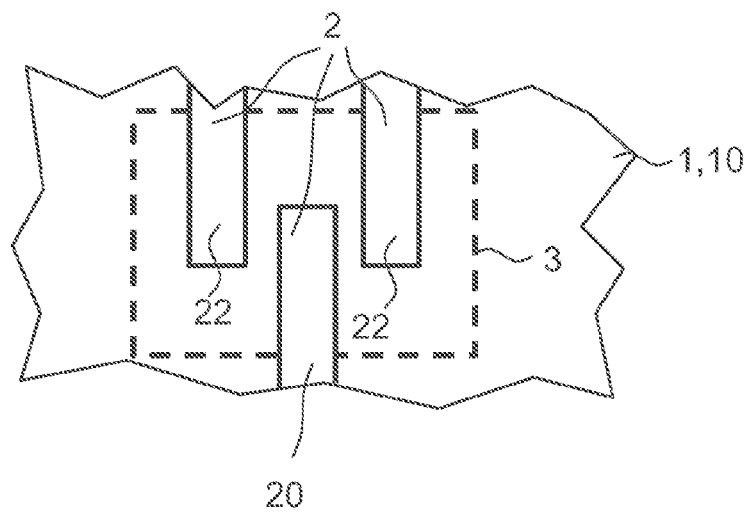
Figure 4C:
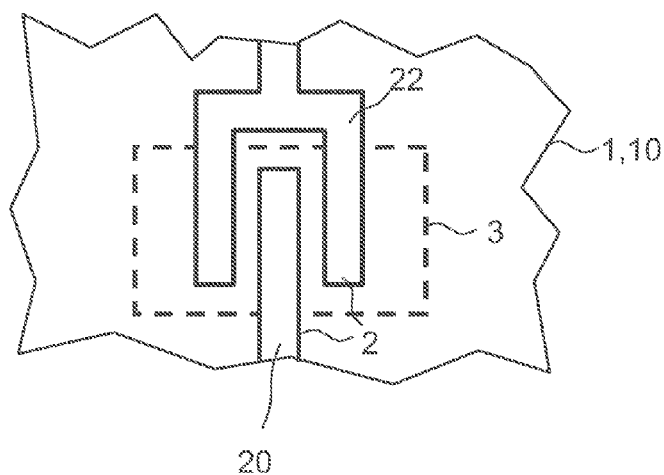

In the exemplary embodiments shown in FIGS. 4A to 4C, in addition to the ridge-shaped contact region 20 respectively present, further contact regions 22 are provided, which are likewise embodied in a ridge-shaped fashion.

The contact regions 20, 22 in accordance with the exemplary embodiment in FIG. 4A are formed alongside one another and extend in the same direction, while the ridge-shaped contact region 20 and the further contact regions 22 in the exemplary embodiments in FIGS. 4B and 4C intermesh in a toothed fashion. In this case, the further contact regions 22 in accordance with the exemplary embodiment in FIG. 4C are connected to one another and have a common lead to a common connection region (not shown).

Figure 4D:
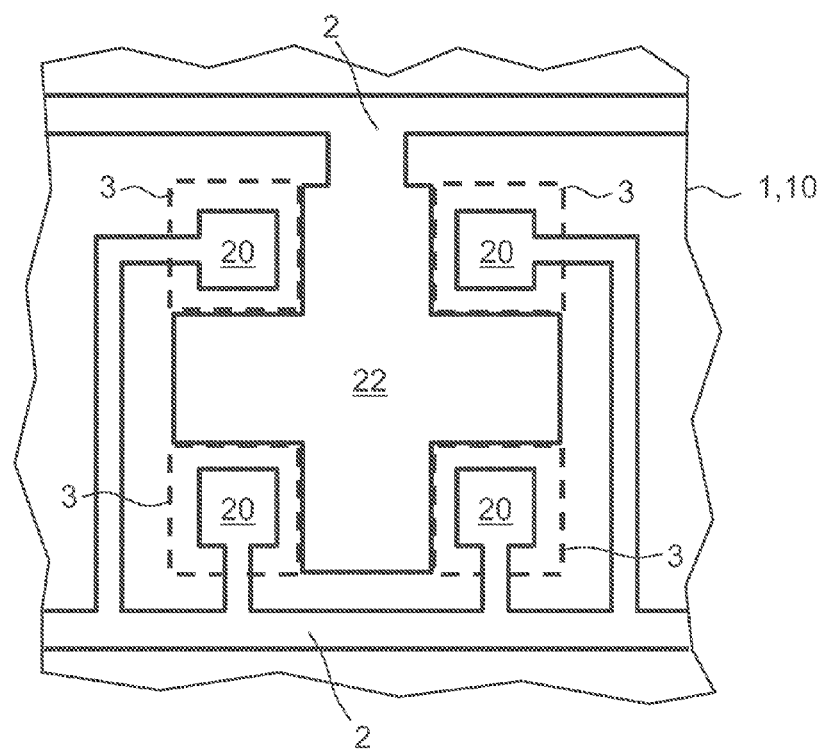

In accordance with the exemplary embodiment in FIG. 4D, the carrier 1 has a plurality of ridge-shaped contact regions 20, which are electrically connected to one another and are arranged around a further contact region 22. In this case, the further contact region 22 is embodied in a cruciform fashion in the exemplary embodiment shown, such that the ridge-shaped contact regions 20 are preferably embodied in a flexible fashion in two mutually perpendicular directions relative to the further contact region 22.

As an alternative to the exemplary embodiments shown, even further contact regions can be present on the carrier, which contact regions can, for example, also be embodied in a ridge-shaped fashion. In particular, the contact regions 20, 22 can be adapted to predefined arrangements of contact areas of semiconductor chips to be mounted.

The exemplary embodiments shown in the figures can comprise further or alternative features in accordance with the embodiments described in the general part. Furthermore, it is also possible to combine the articles and methods and also the respective features described in connection with the exemplary embodiments in FIGS. 1 to 4D.

The invention is not restricted to the exemplary embodiments by the description on the basis of said exemplary embodiments. Rather, the invention encompasses any novel feature and also any combination of features, which in particular includes any combination of features in the patent claims, even if this feature or this combination itself is not explicitly specified in the patent claims or exemplary embodiments.

The invention claimed is:

1. An electrical device comprising:
   a carrier device comprising:
      a carrier comprising an electrically insulating layer; and an electrical contact layer overlying the electrically insulating layer,
  wherein the electrical contact layer comprises a ridge-shaped contact region, and
  wherein a recess is arranged in the electrically insulating layer at least at one side surface of the ridge-shaped contact region or wherein the ridge-shaped contact region has a ridge width that decreases toward the electrically insulating layer; and
an electrical component electrically and mechanically connected to the ridge-shaped contact region, wherein the electrical and mechanical connection is formed by a bonded connection.

2. The electrical device according to claim 1, wherein a recess is arranged in the electrically insulating layer at least at one side surface of the ridge-shaped contact region.

3. The electrical device according to claim 2, wherein the ridge-shaped contact region has a ridge width that decreases toward the electrically insulating layer.

4. The electrical device according to claim 1, wherein the ridge-shaped contact region has a ridge width that decreases toward the electrically insulating layer.

5. The electrical device according to claim 1, wherein the ridge-shaped contact region is arranged between two recesses or two partial regions of the recess, which adjoin side surfaces of the ridge-shaped contact region.

6. The electrical device according to claim 1, wherein the ridge-shaped contact region, apart from one side, is surrounded on all sides by one or a plurality of recesses.

7. The electrical device according to claim 1, wherein the electrical contact layer comprises two ridge-shaped contact regions, which are arranged in a manner directed toward one another and between which the recess is formed in the electrically insulating layer.

8. The electrical device according to claim 1, wherein the electrical contact layer comprises a further contact region which is electrically insulated from the ridge-shaped contact region, and wherein the recess is arranged in the electrically insulating layer between the ridge-shaped contact region and the further contact region.

9. The electrical device according to claim 1, wherein the at least one side surface of the ridge-shaped contact region is slightly etched or undercut by etching.

10. The electrical device according to claim 1, wherein the carrier device is embodied as a circuit board, as a metal core circuit board, as a ceramic carrier, as a glass carrier, as a glass ceramic carrier or as an anodically oxidized carrier.

11. The electrical device according to claim 1, wherein the electrical component and the carrier device have different coefficients of thermal expansion.

12. The electrical device according to claim 1, wherein the electrical contact layer of the carrier device comprises a further contact region that is electrically insulated from the ridge-shaped contact region, wherein the recess is arranged in the electrically insulating layer between the ridge-shaped contact region and the further contact region, and wherein the electrical component is electrically and mechanically connected to the further contact region.

13. The electrical device according to claim 1, wherein the electrical component comprises a light-emitting semiconductor chip embodied as a flip-chip and the electrical device comprises a light-emitting device.

14. The electrical device according to claim 1, wherein the bonded connection is formed by soldering or sintering.

15. A method for producing an electrical device, the method comprising:
  (A) providing a carrier comprising an electrically insulating layer;
  (B) forming an electrical contact layer over the electrically insulating layer, the electrical contact layer having a ridge-shaped contact region;
  (C) forming a recess in the electrically insulating layer by at least partly removing the electrically insulating layer at least at one side surface of the ridge-shaped contact region or forming a ridge width of the ridge-shaped contact region which decreases toward the electrically insulating layer; and
  (D) bonding an electrical component electrically and mechanically to at least one ridge-shaped contact region.

16. The method according to claim 15, wherein step (C) comprises performing an etching method.

17. The method according to claim 16, wherein the etching method comprises wet-chemical etching or ion etching.

18. The method according to claim 16, wherein the electrical contact layer is slightly etched or undercut by etching in a region of the ridge-shaped contact region.

19. The method according to claim 15, wherein step (C) comprises laser processing or embossing.

20. A carrier device for an electrical component, the carrier device comprising:
  a carrier comprising an electrically insulating layer; and
  an electrical contact layer on the electrically insulating layer,
  wherein the electrical contact layer comprises at least one ridge-shaped contact region,
  wherein at least one recess is arranged in the electrically insulating layer at least at one side surface of the ridge-shaped contact region,
  wherein the ridge-shaped contact region has a ridge width that decreases toward the electrically insulating layer, and
  wherein the carrier device is embodied as a circuit board, a metal core circuit board, a ceramic carrier, a glass carrier, a glass ceramic carrier or an anodically oxidized carrier.

* * * * *